(12) United States Patent
Itoi et al.

(10) Patent No.: US 7,782,049 B2
(45) Date of Patent: Aug. 24, 2010

(54) MAGNETIC DEVICE

(75) Inventors: Kazuhisa Itoi, Sakura (JP); Katsubumi Nagasu, Sakura (JP); Takuya Aizawa, Sakura (JP); Osamu Nakao, Sakura (JP); Shigekazu Kawai, Oura-gun (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 12/267,169

(22) Filed: Nov. 7, 2008

(65) Prior Publication Data

US 2009/0066326 A1    Mar. 12, 2009

Related U.S. Application Data

(63) Continuation of application No. PCT/JP2007/059505, filed on May 8, 2007.

(30) Foreign Application Priority Data

May 9, 2006    (JP) .............................. 2006-130015

(51) Int. Cl.
    *G01R 33/02*    (2006.01)
(52) U.S. Cl. ...................... 324/249; 324/244
(58) Field of Classification Search ............ 324/207.21, 324/207.2, 207.22, 244, 249, 251, 252, 260
    See application file for complete search history.

(56) References Cited

U.S. PATENT DOCUMENTS 6,150,809 A * 11/2000 Tiernan et al. .............. 324/238
6,566,872 B1 * 5/2003 Sugitani ...................... 324/249
2006/0017435 A1 * 1/2006 Kang et al. .................. 324/249
2008/0116885 A1 * 5/2008 Van Zon et al. ......... 324/207.21

FOREIGN PATENT DOCUMENTS

| JP | 2001-221838 A | 8/2001 |
| JP | 2002-43649 A | 2/2002 |
| JP | 2003-167037 A | 6/2003 |
| JP | 2003-207553 A | 7/2003 |

OTHER PUBLICATIONS

Olivier Dezuari, et al, "New Hybrid Technology for Planar Fluxgate Sensor Fabrication", IEEE Transactions on Magnetics, Jul. 1999, vol. 35, No. 4, pp. 2111-2117.

* cited by examiner

*Primary Examiner*—Kenneth J Whittington
(74) *Attorney, Agent, or Firm*—Sughrue Mion, PLLC

(57) ABSTRACT

A magnetic device comprises a magnetic element, a first magnetic field application device, and a second magnetic field application device. The first and second magnetic field applying means are disposed on mutually opposite sides of the magnetic element. The magnetic element is, for example, an element in which a soft magnetic film is formed in a meandering shape on a nonmagnetic substrate. The first and second magnetic field application device create a magnetic field in one direction from the first magnetic field application device toward the second magnetic field application device. The bias magnetic field in one direction is thereby applied to the entire soft magnetic film in the magnetic element disposed between the first and second magnetic field application device.

7 Claims, 5 Drawing Sheets

MAGNETIC DEVICE

TECHNICAL FIELD

The present invention relates to a magnetic device that is provided with a magnetic sensor.

BACKGROUND ART

In recent years, in order to cut costs and reduce chip components, devices have been proposed in which induction elements such as magnetic impedance elements are integrated on substrates such as semiconductors. When magnetic impedance elements of this type are used for a magnetic sensor, it is necessary to apply a bias magnetic field to the magnetic impedance elements due to the characteristics of impedance change.

A method that may be considered in order to apply a bias magnetic field to the magnetic impedance elements is, for example, to place magnets adjacent to the magnetic impedance elements (See Japanese Patent Application Laid-Open (JP-A) No. 2002-43649). However, applying a bias magnetic field by means of magnets in this manner poses various problems when applied to magnetic sensors as the magnetic field strength of the individual magnets is not uniform, and it is difficult to consistently apply a bias magnetic field having a constant value.

In contrast, a method of consistently applying a bias magnetic field having a uniform strength to magnetic impedance elements is known in which a spiral-shape or coil-shape conductive layer is formed adjacent to the magnetic impedance elements, and a bias magnetic field is generated by energizing this conductive layer (Japanese Patent Application Laid-Open (JP-A) No.2001-221838). Because a magnetic sensor in which magnetic impedance elements are arranged along a coil center axis of a conductive layer formed in a coil shape, in particular, has the characteristic that it is possible to apply a strong bias magnetic field consistently to the magnetic impedance elements, this method is preferable as it enables highly accurate magnetic sensors to be obtained.

However, in order to apply a bias magnetic field to the magnetic impedance elements, when a coil-shape magnetic field application device is formed around the impedance elements so as to envelop the magnetic impedance elements, the outer configuration of the overall magnetic device is enlarged by this coil, so that the problem has arisen that this has prevented any size reduction or slenderization of any instrument in which this magnetic device is mounted.

SUMMARY OF INVENTION

Exemplary embodiments of the present invention were conceived in view of the above described circumstances, and to provide a magnetic device that is provided with magnetic elements that can be manufactured with a small size and weight and at low cost. However, exemplary embodiments of the present invention need not solve these or any other programs.

A first aspect of the present invention is a magnetic device that includes: a magnetic element; and a first magnetic field application device and a second magnetic field application device that are placed so as to sandwich the magnetic element, and that are used to apply a unidirectional bias magnetic field to the magnetic element.

A second aspect of the present invention is the magnetic device according to the first aspect in which the first magnetic field application device and the second magnetic field application device each include an independent magnetic field generating device and an independent magnetic field induction device.

A third aspect of the present invention is the magnetic device according to the first aspect in which the magnetic field induction devices of both the first magnetic field application device and the second magnetic field application device, and the magnetic element are placed on substantially the same plane.

A fourth aspect of the present invention is a magnetic device that includes: a first substrate having a first conductive layer and a second conductive layer; a second substrate having a third conductive layer and a fourth conductive layer; a magnetic element that is placed between the first substrate and the second substrate; a first connecting portion that electrically connects the first conductive layer and the third conductive layer; a second connecting portion that electrically connects the second conductive layer and the fourth conductive layer; a coil-shaped first magnetic field generating device that includes the first conductive layer, the third conductive layer, and the first connecting portion; a coil-shaped second magnetic field generating device that includes the second conductive layer, the fourth conductive layer, and the second connecting portion; a first magnetic field induction device that passes through the center of the coil shape of the first magnetic field generating device; and a second magnetic field induction device that passes through the center of the coil shape of the second magnetic field generating device.

A fifth aspect of the present invention is the magnetic device according to the fourth aspect in which there is further provided a third substrate that is placed between the first substrate and the second substrate, and the third substrate has a magnetic element housing portion that houses the magnetic element, a first housing portion that houses the first magnetic field induction device, and a second housing portion that houses the second magnetic field induction device, and the magnetic element housing portion is placed between the first housing portion and the second housing portion.

According to exemplary embodiments the magnetic device according to the present invention, as a result of the first magnetic field application device and the second magnetic field application device being placed on both sides of the magnetic element, it is possible to apply a strong bias magnetic field to the magnetic element that is efficient unidirectionally, and it is possible to achieve a highly accurate magnetic sensor.

In addition, a magnetic field generating device that is used to apply a bias magnetic field to a magnetic element can be located away from the magnetic element. Because of this, it is not necessary to form the magnetic field generating device in proximity to the magnetic element. As a result, it is possible to achieve reductions in the size, and particularly in the thickness of the overall magnetic device, and it is possible to improve the degree of freedom in the layout of the instrument on which the magnetic device is mounted.

Exemplary embodiments of the present invention may have the above discussed advantages. However, embodiments of the present invention need not have any advantages.

BRIEF DESCRIPTION OF THE DRAWINGS

FIG. 1 is a perspective view showing an exemplary embodiment of the magnetic device according to the present invention.

FIG. 2 is a perspective view showing another exemplary embodiment of the magnetic device according to the present invention.

FIG. 3 is an exploded perspective view showing another exemplary embodiment of the magnetic device according to the present invention.

FIG. 4 is an explanatory view showing the magnetic field application device shown in FIG. 3.

FIG. 5 is an exploded perspective view showing another exemplary embodiment of the magnetic device according to the present invention.

DETAILED DESCRIPTION OF EXEMPLARY EMBODIMENTS

Figure 1:
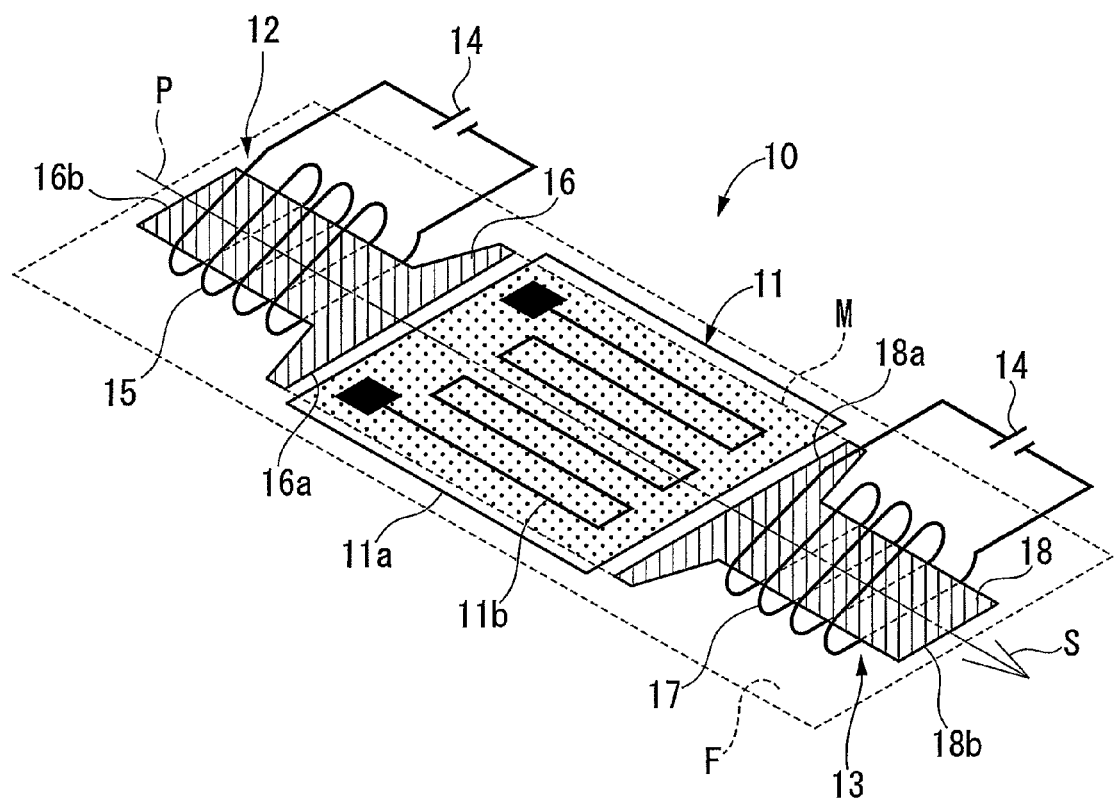
[FIG. 1]

An embodiment of the magnetic device according to the present invention will now be described based on the drawings. Note that the present invention is not limited to this embodiment. FIG. 1 is a perspective view showing an exemplary embodiment of the magnetic device (i.e., magnetic sensor) according to the present invention. A magnetic device 10 of the present invention is provided with a magnetic element 11, and a first magnetic field application device 12 and second magnetic field application device 13 that are positioned so as to sandwich the magnetic element 11.

The magnetic element 11 is obtained, for example, by forming a soft magnetic film 11b in a meandering pattern on a surface of a non-magnetic substrate 11a. The first magnetic field application device 12 and second magnetic field application device 13 form a magnetic field M traveling in one direction S from the first magnetic field application device 12 towards the second magnetic field application device 13. As a result, in the magnetic element 11 that is located between the first magnetic field application device 12 and the second magnetic field application device 13, the bias magnetic field M traveling in the one direction is applied to the entire soft magnetic film 11b.

According to the magnetic device 10 having this structure, as a result of the first magnetic field application device 12 and the second magnetic field application device 13 being placed on both sides of the magnetic element 11, it is possible to apply a strong bias magnetic field to the magnetic element 11 that is efficient in the one direction, and it is possible to achieve a highly accurate magnetic sensor.

In addition, because a magnetic field generating device that is used to apply a bias magnetic field to the magnetic element 11 can be located away from the magnetic element 11, it is not necessary to form the magnetic field generating device in proximity to the magnetic element. As a result, it is possible to achieve reductions in the size, and particularly in the thickness of the overall magnetic device 10, and it is possible to improve the degree of freedom in the layout of the instrument on which the magnetic device 10 is mounted.

The first magnetic field application device 12 and the second magnetic field application device 13 may also each be formed from an independent magnetic field generating device and an independent magnetic field induction device. The first magnetic field application device 12 has a first magnetic field generating device 15 and a first magnetic field induction device 16. The second magnetic field application device 13 has a second magnetic field generating device 17 and a second magnetic field induction device 18.

Both ends of the first magnetic field generating device 15 and the second magnetic field generating device 17 are connected, for example, to a power supply 14, and may be formed by an inductor that is wound in a coil shape. The first magnetic field induction device 16 and the second magnetic field induction device 18 may be formed, for example, by arranging a high permeability material which is formed in a ribbon shape (i.e., in a thin belt shape) such that it passes through a center axis P of the respective coil shapes of the first magnetic field generating device 15 and the second magnetic field generating device 17.

Ends 16a and 18a on one side of the first magnetic field induction device 16 and the second magnetic field induction device 18 which are formed in this ribbon shape (i.e., a thin belt shape) extend to positions adjacent to the magnetic element 11. Ends 16b and 18b on the other side of the first magnetic field induction device 16 and the second magnetic field induction device 18 are formed as open magnetic circuits in order to detect changes in the external magnetic field in the magnetic element 11.

In this manner, by forming the first magnetic field application device 12 and the second magnetic field application device 13 each from an independent magnetic field generating device and an independent magnetic field induction device, when a solenoid coil, for example, is used for the magnetic field application device, it is sufficient for the first magnetic field generating device 15 and the second magnetic field generating device 17, which are small-sized coils, to be formed so as to envelop the first magnetic field induction device 16 and the second magnetic field induction device 18, which are formed from a thin, high permeability material in a ribbon shape, without having to form in the vicinity of the magnetic element a coil, which is a magnetic field generating device, such that it envelops the comparatively large-sized magnetic element 11. Accordingly, it is possible to achieve a reduction in the thickness of the magnetic device 10.

Moreover, by extending the one ends 16a and 18a of the first magnetic field induction device 16 and the second magnetic field induction device 18 to positions adjacent to the magnetic element 11, even if the first magnetic field generating device 15 and the second magnetic field generating device 17 are formed at positions away from the magnetic element 11, it is possible for a bias magnetic field generated by these magnetic field generating devices 15 and 17 to be applied to the magnetic element 11 without being attenuated by the first magnetic field induction device 16 and the second magnetic field induction device 18.

For the high permeability material constituting the first magnetic field induction device 16 and the second magnetic field induction device 18, it is possible to use, for example, a cobalt-based amorphous thin ribbon or a sintered ferrite thin film or the like. In particular, if a cobalt-based amorphous thin ribbon which has pliability is used for the first magnetic field induction device 16 and the second magnetic field induction device 18, then because it is possible to place the first magnetic field generating device 15 and the second magnetic field generating device 17 in positions away from the magnetic element 11, and induce a bias magnetic field in the magnetic element 11 by freely bending the first magnetic field induction device 16 and the second magnetic field induction device 18, it becomes possible to arrange the magnetic device 10 in an unrestricted layout in accordance with the shape of the instrument in which the magnetic device 10 is incorporated.

The first magnetic field induction device 16 and second magnetic field induction device 18 and the magnetic element 11 may be placed on a substantially identical plane F. By placing the magnetic field induction devices 16 and 18 and the magnetic element 11 on substantially the same plane F, the bias magnetic field generated by the first magnetic field generating device 15 and the second magnetic field generating device 17 can be efficiently applied in the direction of the magnetic element 11 while any attenuation thereof is suppressed, thereby enabling a highly sensitive magnetic element 11 to be obtained.

In the above described embodiment, a coil-shaped inductor which is connected to a power supply, namely, an electromagnet is used for the magnetic field generating devices, however, in addition to this it is also possible to use permanent magnets or the like for the magnetic field generating devices.

Figure 2:
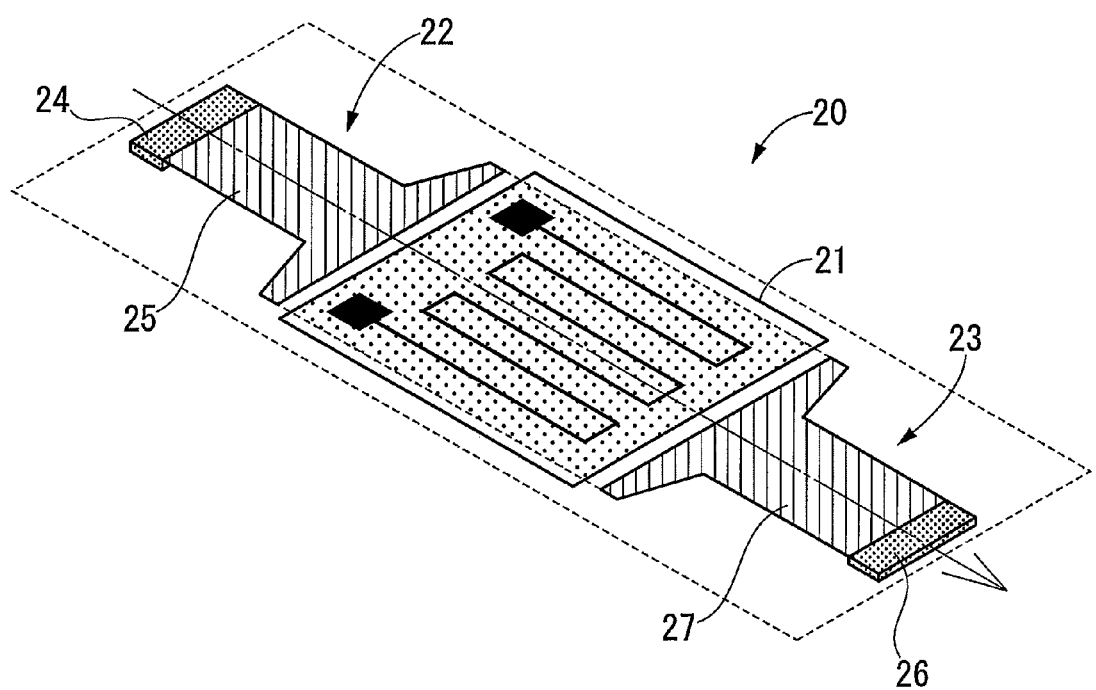
[FIG. 2]

FIG. 2 is a perspective view showing another exemplary embodiment of the magnetic device (i.e., magnetic sensor) according to the present invention. A magnetic device 20 of this embodiment is provided with a first magnetic field application device 22 and a second magnetic field application device 23 which are placed so as to sandwich a magnetic element 21. The first magnetic field application device 22 is formed independently from a first magnetic field generating device 24 and a first magnetic field induction generating device 25, while the second magnetic field application device 23 is formed independently from a second magnetic field generating device 26 and a second magnetic field induction generating device 27.

The first magnetic field generating device 24 and the second magnetic field generating device 26 are formed by permanent magnets, for example, made of NdFeB or SmCo or the like. A bias magnetic field generated by these permanent magnets is inducted to the magnetic element 21 by means of the first magnetic field induction generating device 25 and the second magnetic field induction generating device 27, so that a unidirectional bias magnetic field is applied to the magnetic element 21. By using permanent magnets for the first magnetic field generating device 24 and the second magnetic field generating device 26, it is possible to generate a bias magnetic field without having to supply electricity. Because of this, compared with a magnetic device which uses a solenoid coil or the like, it is possible to simplify the structure, and achieve reductions in both size and weight.

Figure 3:
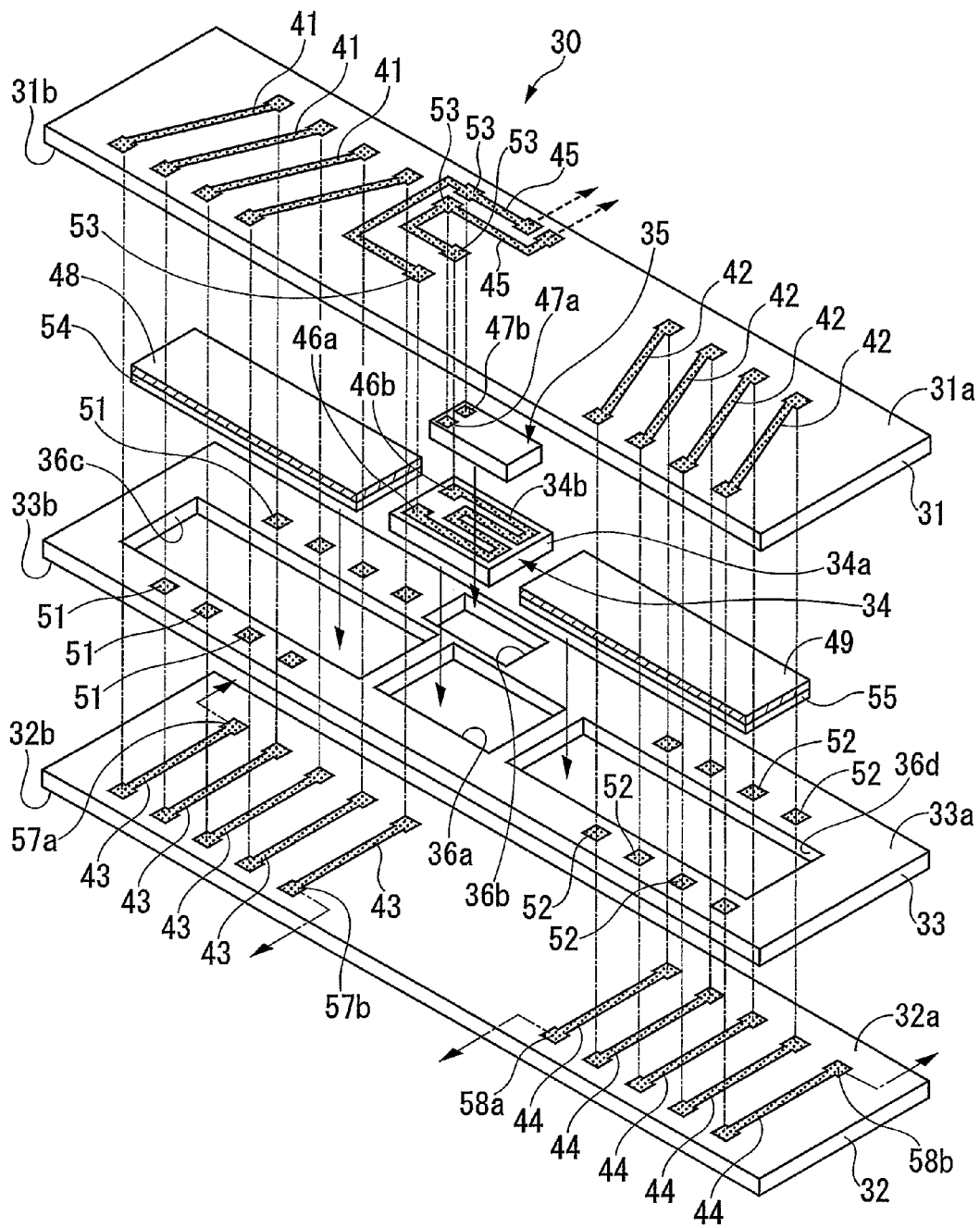
[FIG. 3]

Next, a description will be given of an exemplary embodiment of the magnetic device according to the present invention is formed into a package having a multilayer structure. FIG. 3 is an exploded perspective view showing another exemplary embodiment of the magnetic device according to the present invention. A magnetic device 30 has a first substrate 31, a second substrate 32, a magnetic element 34 which is sandwiched between the first substrate 31 and the second substrate 32, and a first magnetic field induction device 48 and a second magnetic field induction device 49 which are placed so as to sandwich the magnetic element 34 from both sides thereof. It is also possible for a driver chip 35 to be placed between the first substrate 31 and the second substrate 32, and for a third substrate 33 to be provided to house the magnetic element 34 and the driver chip 35.

First conductive layers 41, second conductive layers 42, and extraction conductive layers 45 are formed on a surface 31a of the first substrate 31. Third conductive layers 43 and fourth conductive layers 44 are formed on a surface 32a of the second substrate 32. The magnetic element 34 is obtained, for example, by forming a soft magnetic film 34b in a meandering pattern on a surface of a non-magnetic substrate 34a, and electrode pads 46a and 46b are formed on both ends of the soft magnetic film 34b. When a bias magnetic field is applied to this magnetic element 34, output signals therefrom are changed in accordance with the strength of the magnetic field.

Moreover, the driver chip 35 is an integrated circuit that controls the magnetic element 34, and electrode pads 47a and 47b are formed on a surface thereof. A first non-conductive layer 54, and a second non-conductive layer 55 that insulate the first magnetic field induction device 48 and the second magnetic field induction device 49 from the third conductive layers 43 and the fourth conductive layers 44 are formed respectively on the second substrate 32 side of the first magnetic field induction device 48 and the second magnetic field induction device 49.

Third connecting portions 53 which are formed from conductive paste or copper plating or the like that penetrate from the one surface 31a to the other surface 31b of the first substrate 31 and electrically connect the extraction conductive layers 45 respectively to the electrode pads 46a and 46b of the magnetic element 34 and electrode pads 47a and 47b of the driver chip 35 are formed in the first substrate 31.

In the third substrate 33, there are provided (i) a magnetic element housing portion 36a that houses the magnetic element 34, (ii) a chip housing portion 36b that houses the driver chip 35, (iii) a first housing portion 36c that houses the first magnetic field induction device 48, and (iv) a second housing portion 36d that houses the second magnetic field induction device 49.

In addition, first connecting portions 51 which are formed from conductive paste that penetrate from one surface 33a to another surface 33b of the third substrate 33 and electrically connect the first conductive layers 41 to the second conductive layers 43 are formed in the third substrate 33, and second connecting portions 52 which are formed from conductive paste that penetrate from one surface 33a to another surface 33b of the third substrate 33 and electrically connect the second conductive layers 42 to the fourth conductive layers 44 are formed in the third substrate 33.

Figure 4:
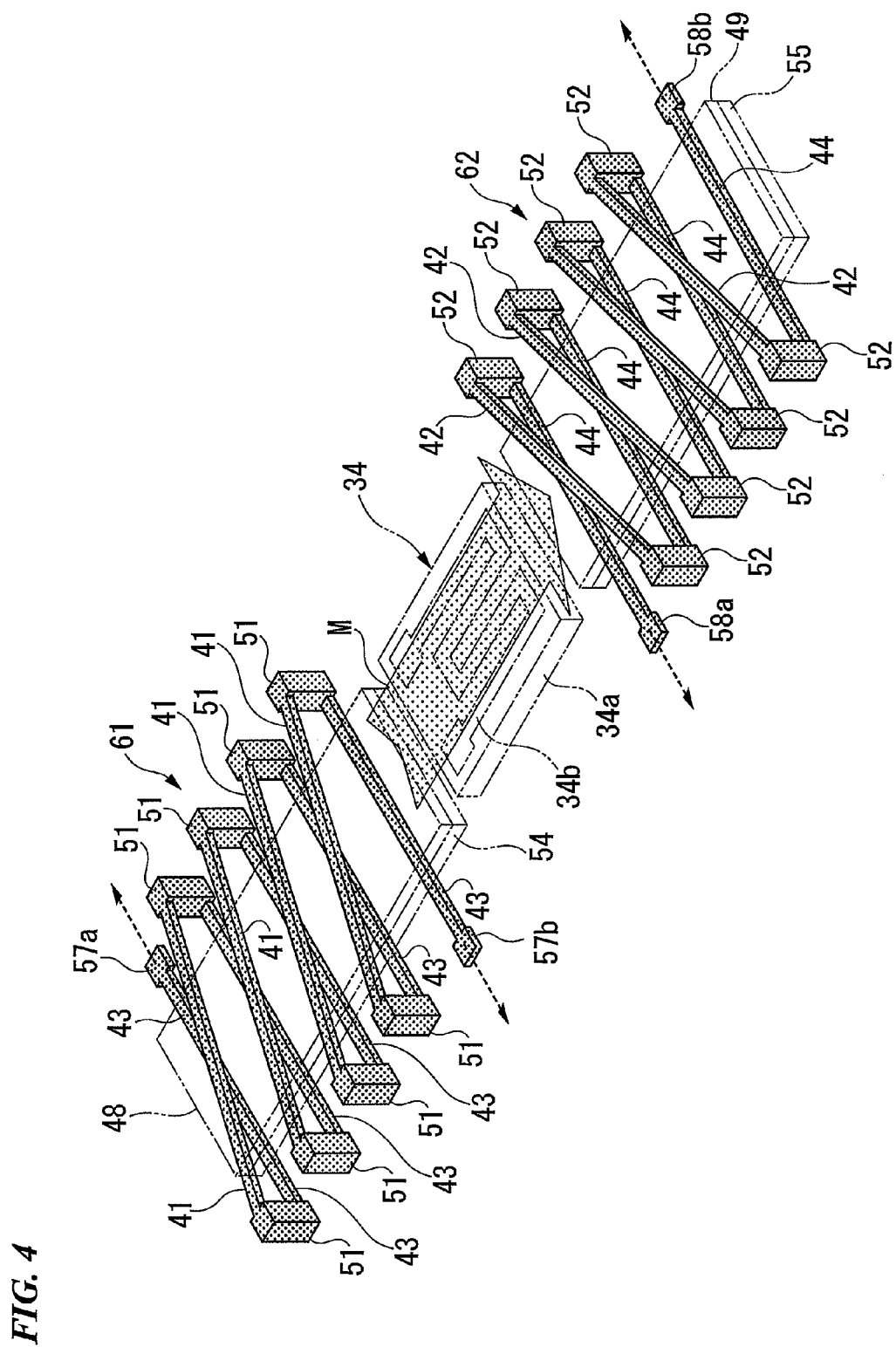
[FIG. 4]

As a result of the first conductive layers 41 and the third conductive layers 43 being electrically connected by the first connecting portions 51, and the second conductive layers 42 and the fourth conductive layers 44 being electrically connected by the second connecting portions 52 in this manner, as is shown in typical view in FIG. 4, a coil-shaped first magnetic field generating device 57 that envelops the periphery of the first magnetic field induction device 48, and a coil-shaped second magnetic field generating device 58 that envelops the periphery of the second magnetic field induction device 49 are formed respectively. A first magnetic field application device 61 is formed by the first magnetic field generating device 57 and the first magnetic field induction device 48, and a second magnetic field application device 62 is formed by the second magnetic field generating device 58 and the second magnetic field induction device 49.

Furthermore, by respectively energizing the electrode pads 57a and 57b at both ends of the first magnetic field generating device 57 and the electrode pads 58a and 58b at both ends of the second magnetic field generating device 58, magnetic fields are generated in the first magnetic field generating device 57 and the second magnetic field generating device 58. The magnetic fields which are generated in the first magnetic field generating device 57 and the second magnetic field generating device 58 are inducted to the magnetic element 34 respectively by the first magnetic field induction device 48 and the second magnetic field induction device 49. As a result, a unidirectional, strong bias magnetic field M is applied to the magnetic element 34.

According to the magnetic device 30 having the above described structure, the first magnetic field generating device 57 and the second magnetic field generating device 58 are formed respectively in a compact coil shape so as to sandwich the magnetic element 34 from both sides while being isolated therefrom, and the bias magnetic fields which are generated by this first magnetic field generating device 57 and second magnetic field generating device 58 can be inducted by the first magnetic field induction device 48 and the second magnetic field induction device 49 without being attenuated thereby, and applied to the magnetic element 34. Accordingly, it is possible to achieve a small, lightweight magnetic device that can be manufactured at low cost.

The first substrate 31 may be formed from a nonconductive resin such as, for example polyimide. The first conductive layer 41, the second conductive layers 42, and the extraction conductive layers 45 which are formed on the first substrate 31 may also be formed on the other surface 31b on the opposite side from the one surface 31a of the first substrate 31. The first conductive layers 41, the second conductive layers 42, and the extraction conductive layers 45 may be formed from a material having superior conductivity such as, for example, copper, aluminum, gold, or the like.

It is sufficient if the soft magnetic film 34b that makes up the magnetic element 34 is, for example, an amorphous soft magnetic material. Moreover, provided that the shape of the soft magnetic film 34b is one that makes it possible to detect magnetism with a high degree of accuracy, then any type of shape may be used in addition to a meandering shape. The first connecting portions 51, the second connecting portions 52, and the third connecting portions 53 may be a conductive paste which is formed by dispersing a fine powder of conductive metal in an adhesive medium. For the first magnetic field induction device 48 and the second magnetic field induction device 49, it is possible to use, for example, a cobalt-based amorphous thin ribbon or a sintered ferrite thin film or the like.

In the above described embodiment, the first substrate 31 and the second substrate 32 are joined so as to sandwich the third substrate 33 using the first connecting portions 51 and the second connecting portions 52 which are formed from the aforementioned adhesive conductive paste, however, in addition to this it is also possible to employ a structure in which the respective layers are joined together by forming adhesive layers using an adhesive agent or the like between the first substrate 31 and the third substrate 33, and between the third substrate 33 and the second substrate 32.

The second substrate 32 may be formed from a nonconductive resin such as, for example, polyimide. The third conductive layers 43 and the fourth conductive layers 44 which are formed on the second substrate 32 may also be formed on the other surface 32b on the opposite side from the one surface 32a of the second substrate 32. The third conductive layers 43 and the fourth conductive layers 44 may be formed from a material having superior conductivity such as, for example, copper, aluminum, gold, or the like.

Figure 5:
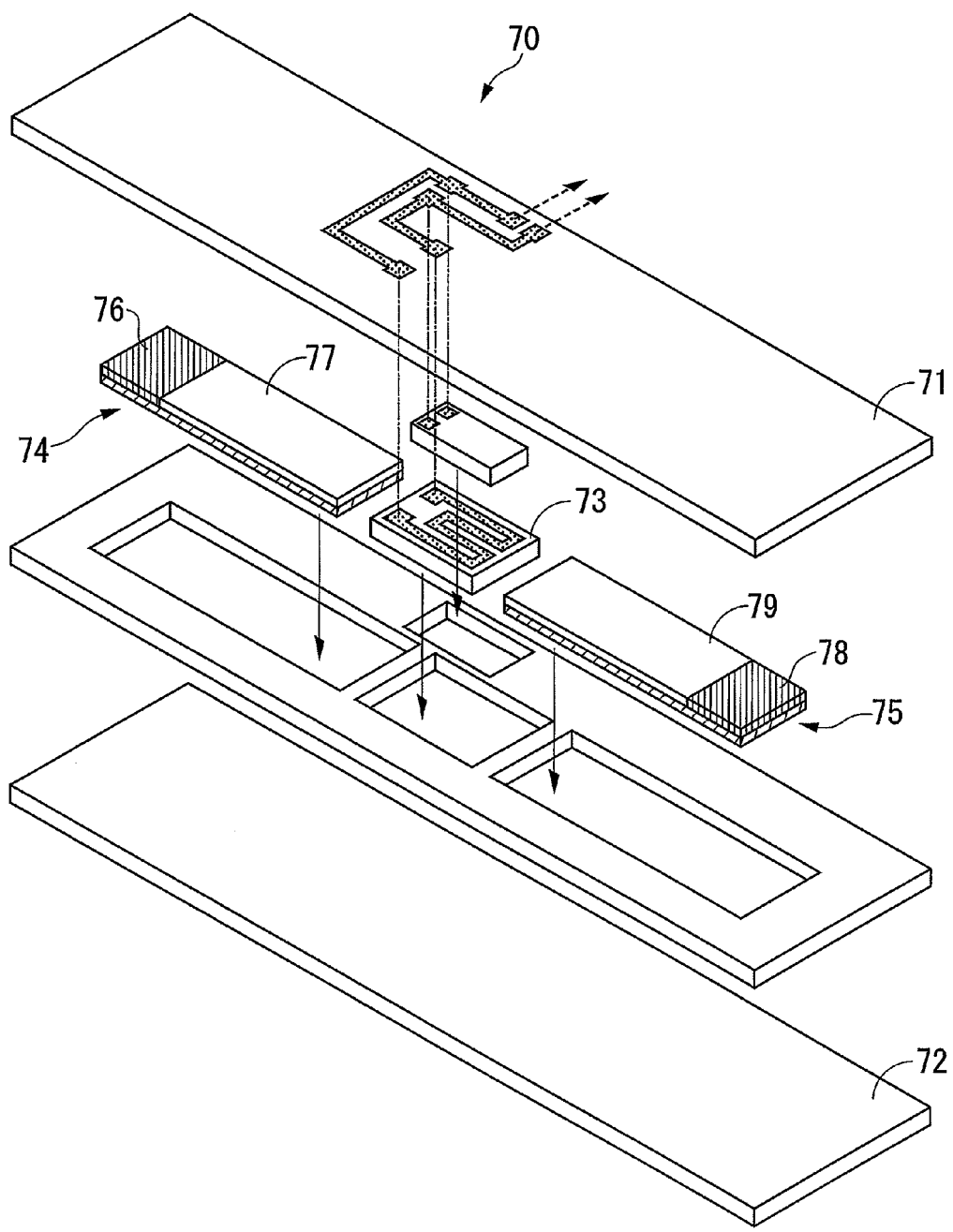
[FIG. 5]

In an example in which the above described magnetic device is formed into a package having a multilayer structure as well, it is also possible to use magnets as the magnetic field generating device. FIG. 5 is an exploded perspective view showing another exemplary embodiment of the magnetic device according to the present invention. In this embodiment, a magnetic device 70 has a first substrate 71, a second substrate 72, a magnetic element 73 which is sandwiched between the first substrate 71 and the second substrate 72, and a first magnetic field application device 74 and a second magnetic field application device 75 which are placed so as to sandwich the magnetic element 73 from both sides thereof.

The first magnetic field application device 74 is formed by the first magnetic field generating device 76 and the first magnetic field induction device 77. The second magnetic field application device 75 is formed by the second magnetic field generating device 78 and the second magnetic field induction device 79. In addition, permanent magnets are used for the first magnetic field generating device 76 and the second magnetic field generating device 78.

As a result, the bias magnetic fields which are generated by the first magnetic field generating device 76 and second magnetic field generating device 78, which are permanent magnets, can be applied to the magnetic element 73 by the first magnetic field induction device 77 and the second magnetic field induction device 79 without being attenuated thereby. By using magnets as magnetic field generating devices in this manner, it is possible to generate a bias magnetic field without having to supply electricity. Because of this, compared with a magnetic device which uses a solenoid coil or the like, it is possible to simplify the structure, and achieve reductions in both size and weight of the magnetic device 70.

EXAMPLES

The effects of the magnetic field induction device constructed from a high permeability magnetic material of the present invention were tested. In a magnetic device such as that shown in FIG. 1, a film of CoZrNb was formed in a meandering pattern on a Si substrate having a chip size of 2.5 mm×1.2 mm×625 μm so as to provide a magnetic element. The bias magnetic field of this magnetic element was 8 (Oe). A ribbon-shaped cobalt-based amorphous alloy having a width of approximately 1 mm and a thickness of 20 μm was used for the magnetic field induction devices. 0.2 A of current was supplied to coil-shaped magnetic field application devices having 120 turns in the coil. The spacing between end portions of the magnetic field induction devices and the magnetic element was 1 mm. The strengths of the bias magnetic fields applied to the magnetic element when one magnetic field induction device in the form of a ribbon-shaped cobalt-based amorphous alloy was used, and when three magnetic field induction devices in the form of ribbon-shaped cobalt-based amorphous alloys were stacked, and when no magnetic field induction device was formed (in order to provide a comparative example) were measured. The results of this test are shown in Table 1.

TABLE 1

| Number of ribbons | Magnetic field strength (Oe) |
| --- | --- |
| 0 (Comparative example) | 2.5 |
| 1 | 6 |
| 3 | 12 |

According to the results shown in Table 1, it was confirmed that it is possible to increase the strength of the bias magnetic field that is applied to a magnetic element by forming a magnetic field induction device. It was also confirmed that it is possible to increase the strength of the bias magnetic field by increasing the number of magnetic field induction devices.

The invention claimed is:

1. A magnetic device comprising:
   a first substrate having a first conductive layer and a second conductive layer;
   a second substrate having a third conductive layer and a fourth conductive layer;
   a magnetic element that is placed between the first substrate and the second substrate;
   a first connecting portion that electrically connects the first conductive layer and the third conductive layer;
   a second connecting portion that electrically connects the second conductive layer and the fourth conductive layer;
   a coil-shaped first magnetic field generating device that includes the first conductive layer, the third conductive layer, and the first connecting portion;

a coil-shaped second magnetic field generating device that includes the second conductive layer, the fourth conductive layer, and the second connecting portion;

a first magnetic field induction device that passes through the center of the coil shape of the first magnetic field generating device;

a second magnetic field induction device that passes through the center of the coil shape of the second magnetic field generating device; and a third substrate that is placed between the first substrate and the second substrate, and the third substrate has a magnetic element housing portion, which houses the magnetic element, a first housing portion, which houses the first magnetic field induction device, and a second housing portion, which houses the second magnetic field induction device, and wherein the magnetic element housing portion is placed between the first housing portion and the second housing portion.

2. The magnetic device according to claim 1, wherein at least one of the first magnetic field generating device and the second magnetic field generating device is a permanent magnet.

3. The magnetic device according to claim 1, wherein at least one of the first magnetic field induction device and the second magnetic field induction device is a cobalt-based thin ribbon.

4. The magnetic device according to claim 1, wherein at least one of the first magnetic field induction device and the second magnetic field induction device is a sintered ferrite thin film.

5. The magnetic device according to claim 1, wherein at least one of the first conductive layer and the second conductive layer is formed from a material at least one of copper, aluminum and gold.

6. The magnetic device according to claim 1, further comprising a third substrate placed between the first substrate and the second substrate;

wherein said third substrate includes a magnetic element housing portion.

7. The magnetic device according to claim 1, wherein each of said first and second substrates are surrounded by each of the connecting portions and each of the conductive layers.

* * * * *